United States Patent [19]

Tomioka et al.

[11] Patent Number: 5,418,743
[45] Date of Patent: May 23, 1995

[54] METHOD OF WRITING INTO NON-VOLATILE SEMICONDUCTOR MEMORY

[75] Inventors: Yugo Tomioka; Shoichi Iwasa; Yasuo Sato; Toshio Wada; Kenji Anzai, all of Sagamihara, Japan

[73] Assignee: Nippon Steel Corporation, Tokyo, Japan

[21] Appl. No.: 161,508

[22] Filed: Dec. 6, 1993

[30] Foreign Application Priority Data

Dec. 7, 1992 [JP] Japan .................................. 4-351216
Mar. 15, 1993 [JP] Japan .................................. 5-080069

[51] Int. Cl.$^6$ ............................................ G11C 11/40
[52] U.S. Cl. ............................ 365/189.01; 365/184; 365/185; 365/218; 365/168
[58] Field of Search ........... 365/184, 185, 218, 189.01, 365/168

[56] References Cited

U.S. PATENT DOCUMENTS 4,964,079 10/1990 Devin ................................. 365/184
5,068,827 11/1991 Yamada et al. .................... 365/185

OTHER PUBLICATIONS

Y. Tokioka, Y. Sato, S. Iwasa, K. Anzai, and T. Wada, "The Proposal of Multi-Bit Type Flash Memory", The 53rd Autumn Meeting, 1992, The Japan Society of Applied Physics, No. 2, 17a-ZS-9.

Primary Examiner—Joseph A. Popek
Assistant Examiner—F. Niranjan
Attorney, Agent, or Firm—Pollock, Vande Sande & Priddy

[57] ABSTRACT

A method of using a non-volatile semiconductor memory comprising a plurality of row and column lines, a plurality of memory cells disposed at intersections of the row and column lines and a plurality of reference cells disposed on each of the row lines. Each memory cell includes an MOS transistor having a substrate, a spaced-apart drain and source formed on one surface of the substrate, a channel region between the drain and source and a lamination of a tunnel insulating film, a floating gate, an interlayer insulating film and a control gate formed in that order on the channel region. Each reference cell has the same electrical characteristic as the memory cell, with the method including:

(1) when writing data into each of the memory cells:
  (a) presetting threshold voltages of the MOS transistor to correspond to at least three different data to be stored in each of the memory cells; and
  (b) applying to the control gate and the drain the MOS transistor included in a selected memory cell, respectively, a selected high voltage, and a voltage determined according to one of the preset threshold voltages corresponding to one of the at least three different data to be stored while maintaining the source in a floating voltage condition; and (2) when reading out data of the memory cell:
  (a) selecting the reference cells disposed on one of the row lines on which a selected one of the memory cells is disposed; and
  (b) setting threshold voltages of the selected reference cells at values determined based on the preset threshold voltages.

13 Claims, 3 Drawing Sheets

METHOD OF WRITING INTO NON-VOLATILE SEMICONDUCTOR MEMORY

BACKGROUND OF THE INVENTION

1. Field of the Invention

The present invention relates to a method of writing into an electrically alterable non-volatile semiconductor memory. More specifically, the present invention concerns a method of selectively writing any one of more than two values into each memory cell.

2. Description of the Related Art

An electrically writable and erasable non-volatile semiconductor memory is known as an EEPROM. In particular, there is such an EEPROM capable of wholly erasing data written therein, which is referred to as a flash EEPROM. Each of memory cells of this flash EEPROM employs a MOS transistor including a drain region and a source region, which are fabricated on one surface of a substrate and are mutually separated from each other, and a channel region formed therebetween. The MOS transistor further includes a tunnel insulating film, a floating gate electrode, an interlayer insulating film, and a control electrode, which are successively formed on this channel region.

To write data into such a memory cell, electron charges are injected via the tunnel insulating film into the floating gate, thereby causing the memory cell to take a first state indicating, for instance, data "1" where a threshold voltage of the memory cell is set to a high value, and conversely, data "0" is represented by a second state of the memory cell where the threshold voltage of the memory cell is set to a low value by removing the electron charges from the floating gate. This stored data is read out by sensing whether the memory cell is set into the first state, or the second state, by applying to the control gate electrode a voltage lower than the above-explained higher threshold voltage value and higher than the lower threshold voltage value.

The above-described conventional EEPROM can store only data having two different values, since the respective memory cells are selectively set to one of the first and second state, resulting in small memory capacities. To allow a recent trend of increasing data amounts, it is desired to develop an EEPROM having a large memory capacity with a small number of memory cells.

To this end, the inventors have proposed a method of selectively writing 4-value data into each of the memory cells of EEPROM in "The Proposal of Multi-bit type Flash Memory", at the 53rd Autumn Meeting, 1992, The Japan Society of Applied Physics, 17a-ZS-9. However, this proposal merely described the very basic idea. Thus, there are many difficulties to practically realize this type of flash memory.

SUMMARY OF THE INVENTION

The present invention has been made to solve the above-described problems of the prior art, and has an object to provide a method of selectively writing any one of more than two values into each memory cell of the non-volatile semiconductor memory.

In accordance with the present invention, a method of writing data into a non-volatile semiconductor memory having a plurality of memory cells, wherein each memory cell includes a MOS transistor having drain and source regions, which are mutually separated from each other and formed on one surface of a substrate, a channel region formed therebetween, and a tunnel insulating film, and further a floating gate electrode, an interlayer insulating film, and a control gate electrode, which are successively formed on the channel region, comprises the steps of: previously determining threshold voltages of the MOS transistor corresponding to more than two different data to be written into the non-volatile semiconductor memory; applying a selected high voltage to the control gate of the MOS transistor of a selected memory cell; and applying to the drain electrode of the MOS transistor of the selected memory cell a voltage selected to correspond with the threshold voltage which has been set in accordance with a selected one of the more than two different data to be written, and making the source electrode of the MOS transistor to a state where no voltage is applied.

According to the present invention, at least three threshold voltages of different levels are previously determined between a higher threshold voltage level and a lower threshold voltage, which can be set to the MOS transistor of each memory cell of the non-volatile semiconductor memory device, so that the at least three different threshold voltages correspond to respective different data to be written in the memory cell. Selected voltages are applied to the gate electrode, source electrode, drain electrode of the MOS transistor of the memory cell to which the data should be written. As a result, the amount of electron charges injected from the channel region of the MOS transistor into the floating gate is controlled so that the threshold voltage of the MOS transistor is set to a value corresponding to the selected data to be written. When the written data is read out, voltages slightly lower than the respective preset threshold voltage levels are sequentially applied to the control gate, so that the threshold voltage of the respective MOS transistor is detected and the data written into the memory cell can be read out.

DESCRIPTION OF THE PREFERRED EMBODIMENTS

Figure 1:
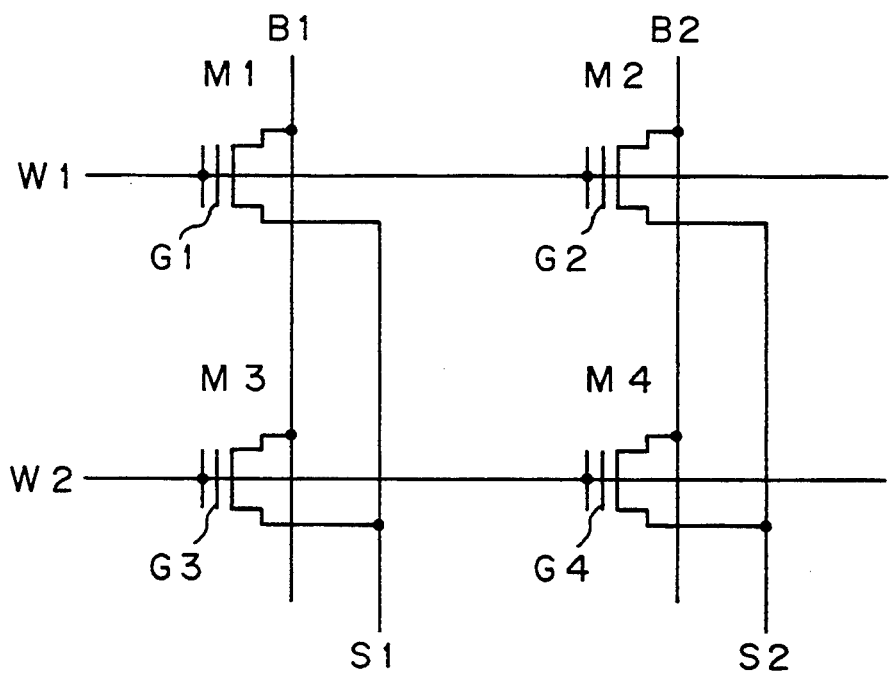
FIG. 1 shows a diagram for explaining a method of writing data into memory cells of an EEPROM.

Referring now to the accompanying drawings, embodiments of the present invention will be described. First, a method of writing data into each memory cell of an EEPROM will now be explained with reference to FIG. 1 that shows a circuit portion of this EEPROM.

Each of the memory cells M1 to M4 is constructed of a MOS transistor and includes a floating gate. A word line W1 is connected to control gates of the memory cells M1 and M2, and a word line W2 is connected to control gates of the memory cells M3 and M4. It should be noted that in fact, each word line and control gates are fabricated in an integral form by, for instance, polysilicon, and the word line per se functions as the control gates for the respective memory cells in the regions of these memory cells. On the other hand, a bit line B1 is connected to drains of the memory cells M1, M3, and a bit line B2 is connected to drains of the memory cells M2, M4. Furthermore, sources of the memory cells M1, M3 are connected to a common source line S1, and sources of the memory cells M2, M4 are connected to a common source line S2.

Figure 2:
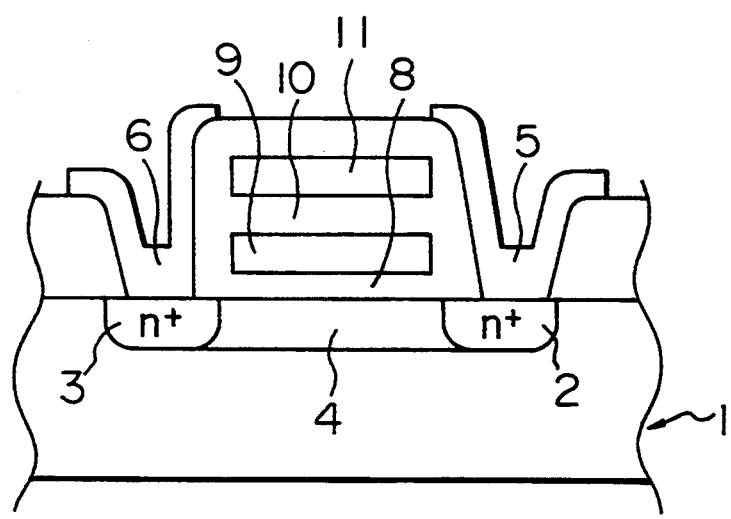
FIG. 2 schematically represents a structure of a MOS transistor constituting each memory cell shown in FIG. 1.

In FIG. 2, there is shown a sectionally viewed structure of a MOS transistor constituting each memory cell. A drain 2 made of an n type impurity diffusion layer, and a source 3 made of the same type impurity diffusion layer are formed on a surface of a P type silicon substrate 1 and separated from each other so that a channel region 4 is formed between the drain 2 and the source 3. A tunnel insulating film 8 of $SiO_2$ having a thickness of approximately 10 nm is formed above the channel region, on which a floating gate 9 of low resistance polysilicon, an interlayer insulating film 10, and a control gate 11 of low resistance polysilicon are successively formed. A bit line 5 and a source line 6 are connected to the drain 2 and the source 3, respectively.

When data is written into such a memory cell, for instance, a substrate 1 is grounded, the potential of the control gate 11 is set to a high value thereby increasing the potential of the floating gate 9 by capacitance coupling so that electron charges are injected from the substrate 1 via the tunnel insulating film 8 of a very thin oxide film into the floating gate 9. According to the conducting mechanism of a very thin oxide film, an electric field of an order of 6 to 7 MV/cm is required to effect the Fowler-Nordheim tunneling with respect to the above-described thickness of the very thin oxide film. As a result of accumulation of electrons into the floating gate 9, the threshold voltage of the MOS transistor is shifted to the plus direction, as viewed from the control gate 11.

Then, as a first embodiment of the present invention, a description will now be made of a method of selectively writing four binary data [00] to [11] into the respective memory cells M1 to M4 of the above-explained EEPROM.

First, four levels of 2 V, 3 V, 4 V and 5 V are determined as threshold voltages of the respective memory cells corresponding to these four data.

For example, when data [11] is written into the memory M1, a high voltage in a range of 12 V to 15 V is applied to the word line W1, and other word lines are under floating condition, or coupled to the ground potential. Then, the bit line B1 is grounded, and each of the other bit lines is biased at 3 V. At this time, the source lines S1 and S2 are opened, thereby rendering to floating state. As a consequence, a voltage of 12 V to 15 V is applied to the control gate electrode of the memory cell M1, and also the voltage of the drain electrode is set to zero volt. Then, the source electrode is brought into the floating state. Electron charges are injected into the floating gate at an amount corresponding to a potential difference between the control gate electrode and the drain electrode into the floating gate, and the threshold voltage of the memory cell M1 is set to 5 V.

Figure 3:
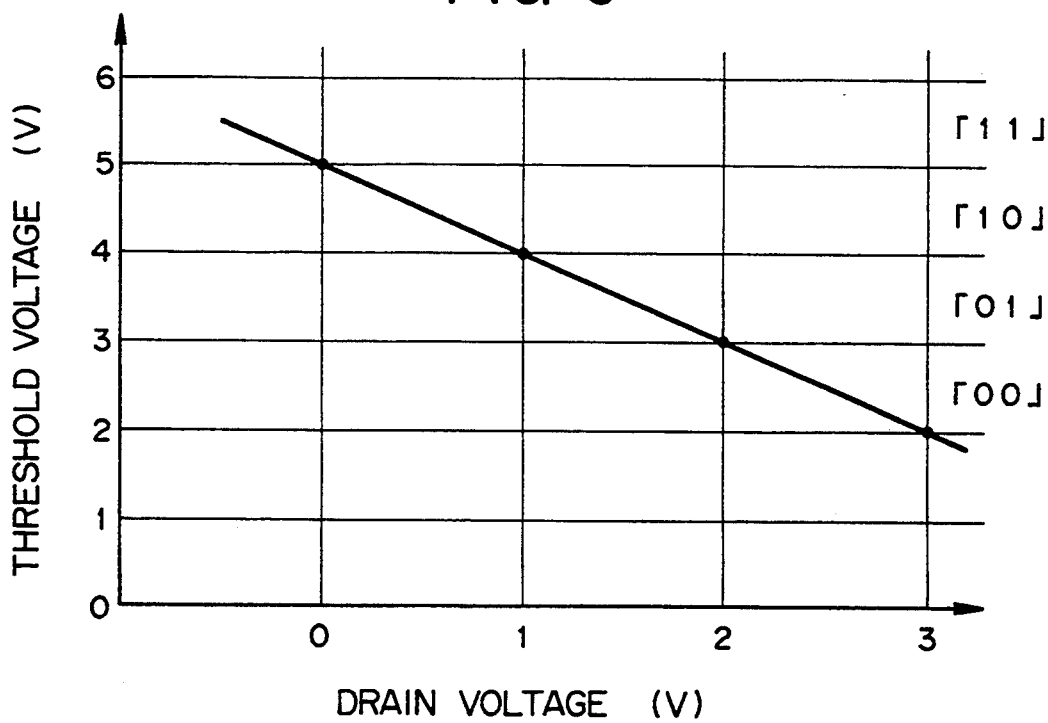
FIG. 3 is a graphic representation showing a relationship between a voltage to be applied to a drain electrode and a threshold voltage of a memory cell when data is written into each memory cell according to a first embodiment of the present invention.

Subsequently, when the data [10] is written into the memory cell M1, both the word line W1 and the source line S1 are brought into the same conditions as the above case, and a pulse voltage of a potential of 1 V is applied to the bit line B1, namely the drain. As a consequence, the threshold voltage of the memory cell M1 is set to 4 V. Similarly, the threshold voltage is set to 3 V (data [01]) by setting the drain voltage at 2 V and the threshold voltage is set to 2 V (data [00]) by setting the drain voltage at 3 V. A relationship between the drain voltage and the threshold voltage of the memory cell in this embodiment is shown in FIG. 3. As seen from this drawing, in accordance with the present embodiment, the threshold voltage of the memory cell can be set to any of four states of 2 V, 3 V, 4 V and 5 V in correspondence with the voltage levels of the drain voltages. Any of four data of [00] to [11] can be stored in this way by representing these data by the respective threshold voltages. Similarly, four data can be selectively stored into each of the memory cells M2 to M4.

When the data thus written into the selected memory cell is to be read out, which one of data [00] to [11] is stored in the selected one of the memory cells M1 to M2 is detected by applying, for example, 5 V to the word line W1 and comparing the drain current of each of reference cells whose threshold voltages are preliminarily set to respective levels with the drain current of the selected memory cell.

It will be understood that although the threshold voltage of each memory cell is set selectively to four different voltages in the above-explained embodiment, more data may be stored by dividing the threshold voltage into more levels. Also, the threshold voltage of each memory cell is changed by changing the drain voltage, namely its pulse height in the above-described embodiment. Alternatively, as disclosed in, for instance, Japanese Patent Application No. 5-239135 filed on Aug. 31, 1993 (U.S. Ser. No. 08/112,997) claiming the domestic priority based on Japanese Patent Applications Nos. 4-255608, 4-255609, and 4-255610 filed on Aug. 31, 1992, the threshold voltage of each memory cell may be varied by changing total application time of the pulse voltage, namely the pulse width. Furthermore, it should be noted that the relationship between the gate voltage or the drain voltage and the threshold voltage of each memory cell, as mentioned in this embodiment, may be changed depending on the structure of memory cell, the thickness of interlayer insulating film, the thickness of the tunnel insulating film and so on.

Figure 4:
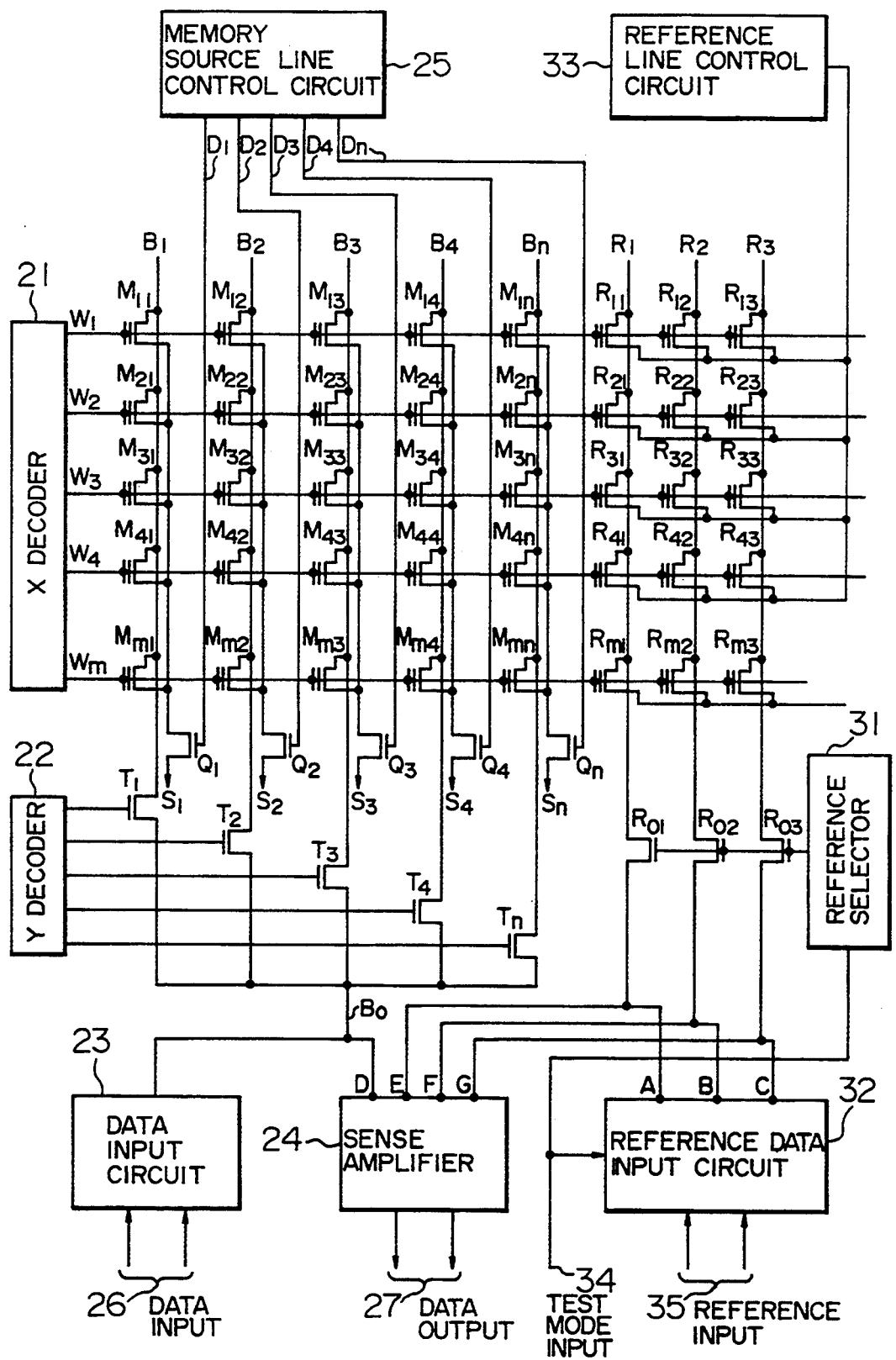
FIG. 4 schematically represents an arrangement of a major portion of an EEPROM to which the method of the present invention is applied.

FIG. 4 is a circuit diagram of an EEPROM to which the present invention is applied. Memory cells M11, M12, - - - , Mmn are connected in a matrix of columns and rows. Drains of memory cells $M_{1i}$, $M_{2i}$, - - - , Mmi (i=1, - - - , n) of each column are connected to a bit line Bi, control gates of memory cells $M_{j1}$, $M_{j2}$, - - - , Mjn (j=1, - - - , m) of each row are connected to a word line Wj. In the embodiment, cut-off MOS transistors Q1 to Qn are provided to respective source lines S1 to Sn for cutting them off. Then, the source of a selected one of memory cells $M_{11}$-$M_{mn}$, into which data is to be written, can be brought to the floating condition by turning off the cut-off MOS transistor provided to the source line connected to the source of the selected memory cell by one of the control line D1 to Dn.

As a reference cell circuit, there is provided a circuit in which MOS transistor R11, R21, - - - , Rm1, R12, R22, - - - , Rm2, R13, R23, - - - , Rm3, each having the same characteristic as that of the memory cell, are arranged in a matrix of three columns and m rows. Three reference cells of the same row as that of the selected memory cell are selected. The data written into the selected memory cell is judged by comparing in sequence the drain current of the selected memory cell with the drain currents of the selected reference cells. The operation of the circuit shown in FIG. 4 will be discussed later.

Next, a description will be made of a second embodiment of the present invention. Similarly to the first embodiment, four binary data [00] to [11] are selectively written. However, voltages applied to the word line and the bit line are different from those in the first embodiment.

For instance, when the data [11] is written into the memory cell M1, the bit line B1 is grounded, the source line S1 is opened, and a pulse voltage of 10 to 15 V is applied to the word line W1. As a consequence, a voltage is induced on the floating gate G1 of the memory cell M1, and electron charges are injected into the floating gate G1 at a predetermined amount according to Fowler-Nordheim tunneling in correspondence with a potential difference between this floating gate G1 and the drain. Then, a threshold voltage of the memory cell M1 is increased to approximately 7 V. This state is assumed as "11". It should be noted that at this time, no Fowler-Nordheim tunneling occurs in the memory cells other than the memory cell M1 by applying a voltage of approximately 3 V to the bit lines other than the bit line B1, and therefore no data writing into these memory cells is carried out.

Similarly, when the data "10" is written into the memory cell M1, a voltage of approximately 1 V is applied to the bit line B1, and others are set to the same as the above when "11" is written. As a consequence, the threshold value of memory cell M1 becomes about 5 V, and this condition is assumed as "10".

Furthermore, when the data "01" is written into the memory cell M1, a voltage of approximately 2 V is applied to the bit line B1, and others are set to the same as the above. As a result, the threshold voltage of the memory cell M1 is set to about 3 V, and this condition is assumed as "01".

In addition, when the data "00" is written into the memory cell M1, a voltage of approximately 3 V is applied to the bit line B1, and others are set to the same as the above. In this case, the threshold voltage of the memory M1 is about 1 V, which is not substantially changed from the initial threshold value (erasing level). This condition is assumed as "00".

Figure 5:
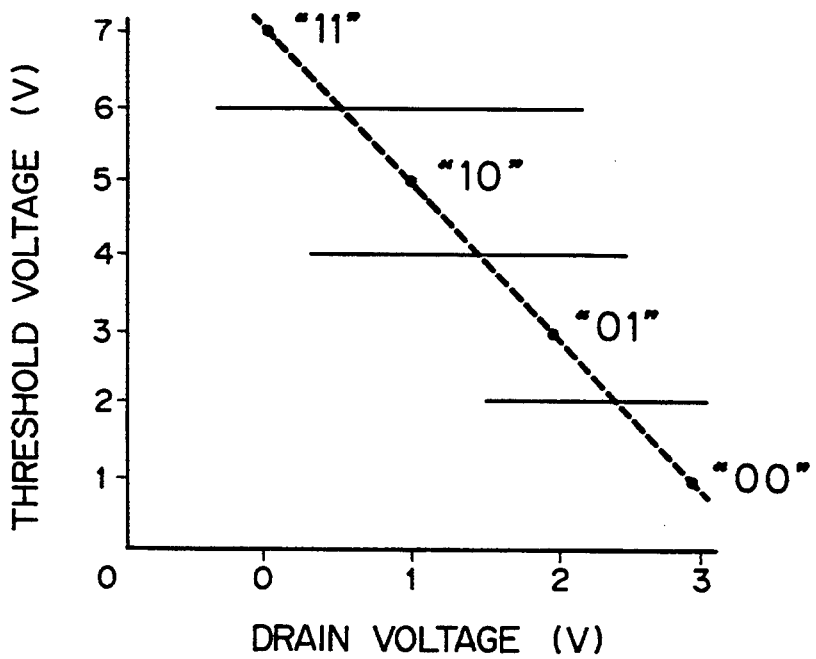
FIG. 5 is a graphic representation indicating a relationship between a voltage to be applied to a drain electrode and a threshold voltage of a memory cell when data is written into each memory cell, according to a second embodiment of the present invention.

A relationship between the voltage applied to the drain of the memory cell and the threshold voltage, according to this embodiment, is shown in FIG. 5.

In case of reading out of this memory cell M1, for example, a voltage of 1 V is applied to the bit line B1, and all of the potentials for the bit lines other than the bit line B1 are set to 0 V, and also all of the potentials of the source lines are set to 0 V. Then, under this condition, a voltage of 5 V is applied to the word line W1, and the reading operation is carried out by comparing a current flowing through the source-to-drain path with currents of the reference cells which are previously set to four conditions, respectively.

The storage contents of all memory cells are collectively erased at a time.

Next, a description will be made of a circuit of FIG. 4. As illustrated in this drawing, word lines W1, W2, - - -, Wm are connected to an X decoder 21 for selecting one of the word lines. On the other hand, bit lines B1, B2, - - -, Bn are connected via transistors T1, T2, - - -, Tn to a data input circuit 23 and a sense amplifier 24, respectively, and gates of the transistors T1, T2, - - -, Tm are connected to an Y decoder 22 for selecting one of the bit lines. To select one of memory cells arranged in a matrix form, a predetermined voltage is applied by an X decoder 21 to the word line connected to the gate of the memory cell to be selected and the word lines other than this word line are biased at the ground potential. A Y decoder 22 applies a predetermined voltage to the gate of the transistor connected to the selected bit line, thereby conducting this transistor and connecting this bit line to a data input circuit 23 and a sense amplifier 24. The transistors connected to other bit lines are held under non-conducting state.

The sources of the memory cells connected to the respective bit lines aregrounded via the transistors Q1, Q2, - - -, Qn, and the gates of the transistors Q1, Q2, - - -, Qn are connected via the respective control lines D1, D2, - - -, Dn to a memory source line control circuit 25. When data is written, the transistor connected to the source of the selected memory cell is brought into the non-conducting condition or the floating state. On the other hand, when data is read, all of the transistors are brought into the conducting state.

One of the data "00", "10", "01", and "11" to be written into the selected memory cell is supplied to a data input of a data input circuit 23. The data input circuit 23 produces a voltage in correspondence with the supplied data, and applies this voltage via the corresponding bit line to the drain of the selected memory cell. As a consequence, the selected memory cell is set to a threshold voltage determined in correspondence with the inputted data.

Then, a description will be made of the reference cell circuit. The reference cell circuit is to set reference currents which are sequentially compared with a drain current of a selected memory cell when data written into the memory cell is read. To the end, this threshold voltage of each reference cell is set to a value determined depending on the threshold voltages at which each memory cell is set selectively. For example, as in the second embodiment, when the threshold voltage of the memory cell is set to one of 1 V, 3 V, 5 V and 7 V in correspondence with the input data, the threshold voltages of the respective reference cells are set as follows.

First, for instance, a selection signal "1" is externally supplied to a test mode input 34, so that both a reference data input circuit 32 and a reference selector 31 are activated. The reference selector 31 produces a gate voltage of, for example, 15 V, so that transistors R01, R02, R03 become conductive. On the other hand, the sources of the respective reference cells are brought into the floating conditions by a reference source line control circuit 33. First, in order to set the threshold voltages of the reference cells R11, R12 and R13, the word line W1 is selected by the X decoder 21 and 15 V is outputted to the word line W1. Under this condition, a preselected signal, for example, "00" is inputted to a reference input 35. The voltages of 9 V, 7 V, 5 V produced from the output terminals A, B, C of the reference data input circuit 32, are applied via the transistors R01, R02, R03 and the bit lines R1, R2, R3 to the drains of the selected memory cells Rll, R12, R13, whereby the threshold voltages of these memory cells are set to 2 V, 4 V, 6 V, respectively. Similarly, the word lines W2, W3, - - -, Wm are sequentially selected, and the above-described process is repeated, so that the threshold voltage of each of the memory cells connected to the bit line B1 is set to 2 V, the threshold voltage of each of the memory cells connected to the bit line B2 is set to 4 V, and the threshold voltage of each of the memory cells connected to the bit line B3 is set to 6 V.

When data is read out from a memory cell, the transistors Q1, Q2, - - -, Qn are rendered conductive by a memory source line control circuit 25, whereby the sources of the respective memory cells are brought into the ground condition. Also, the respective sources of the reference cells are brought into the ground state by a reference source line control circuit 33. Subsequently, a selection is made of the word line and the bit line connected to the memory cell to be read out by the X decoder 21 and the Y decoder 22. In the case that, for instance, the memory cell M11 is to be read, the word line W1 and the bit line B1 are selected, 6 V is applied to the word line W1, and 0 V is applied to other word lines. Also, the transistor T1 connected to the bit line B1 is made conductive, and the transistors connected to other bit lines are made non-conductive. At the same time, both the sense amplifier 24 and the reference selector 31 are activated, and a voltage of 1 V is derived from each of the output terminals D, E, F and G of the sense amplifier 24. In response to the outputs from the reference selector 31, the transistors R01, R02, R03 become conductive. As a result, a current "I0" corresponding to the threshold voltage set to the selected memory cell M11 flows from the output terminal D of the sense amplifier 24 via the line B0 and a drain-to-source circuit of the memory cell M11. On the other hand, currents I1, I2, I3 corresponding to the threshold voltages set to the respective reference cells flow from the output terminals E, F, G via the transistors R01, R02, R03, and the drain-to-source circuits of the reference cells R11, R12, R13, respectively. The sense amplifier is of differential amplifier type which compares the current I0 with the currents I1, I2, I3, successively. When the threshold voltage of the memory cell M11 is set to 7 V, the current I0 is higher than any of the currents I3, I2, I1. When the threshold voltage of the memory cell M11 is set to 5 V, the current I0 is lower than the current I3 and higher than the current I2. When the threshold voltage of the memory cell M11 is set to 3 V, the current I0 is lower than any of the currents I3 and I2, and higher than the current I1. When the threshold voltage of the memory cell M11 is set to 1 V, the current I0 is lower than any of the currents I3, I2, I1. Thus, the level of the threshold voltage set to the memory cell can be judged by comparing the current I0 with the currents I1, I2, I3, sequentially. The sense amplifier 24 outputs one of the data "00", "10", "01" and "11" corresponding to the threshold voltage set to the memory cell M11 to the data output 27.

As previously explained, according to the method of this embodiment, 4-value data of "00" to "11" can be stored into the unit memory cell, and also can be read out. As a consequence, when the number of memory cells is the same as that of the conventional memory cells, the amount of information twice the amount of that of the conventional memory cells can be stored.

It should be noted that when using threshold voltages corresponding to those obtained by equally subdividing between a highest threshold voltage level and a lowest threshold voltage level which can be set to each memory cell, as the number of subdivisions becomes larger, a larger number of different data can be stored in one memory cell. In this case, it is required to select the number of subdivisions so that the level difference between two closest threshold voltages is larger than an allowable minimum level difference with which no error occurs when judging the threshold voltage set to each memory cell by considering the variation of characteristics in production of the MOS transistor constituting each memory cell. This allowable minimum level difference is determined based on experimental study. Further, although specific voltage values are shown in the above embodiments, those voltage values may be changed depending on the structure of the memory cell, and particularly, the thickness of the tunnel insulating film, that of the interlayer insulating film and so on.

We claim:

1. A method of using a non-volatile semiconductor memory device comprising a plurality of memory cells disposed in a matrix of rows and columns, a plurality of reference cells disposed on each of said rows, a plurality of bit lines and a plurality of word lines, each of said memory cells including a MOS transistor having a substrate, spaced apart drain and source formed on one surface of said substrate, a channel region disposed between said drain and source and a lamination of a tunnel insulating film, a floating gate, an interlayer insulating film and a control gate formed in that order on the channel region, each of said reference cells having the same electrical characteristic as that of the memory cell, each of said bit lines being connected to the drains of the MOS transistors of the memory cells disposed on one of said columns and each of the word lines being connected to the control gates of the MOS transistors of the memory cells disposed on one of said rows, said method comprising the steps of:
    (1) when writing data into one of said memory cells:
        (a) preliminarily determining threshold voltages of said MOS transistor to correspond to at least three different data to be stored in each of said memory cells; and
        (b) selecting one of said word lines connected to the control gate of the MOS transistor included in a selected one of the memory cells in which one of said at least three different data is to be stored and one of said bit lines connected to the drain of the MOS transistor of said selected memory cell;
        (c) applying a selected high voltage to said selected word line; and
        (d) applying a voltage determined in accordance with one of said preliminary determined threshold voltages corresponding to one of said at least three different data to be stored in said selected memory cell, to said selected bit line; and
    (2) when reading out data stored in each of the memory cells:
        (a) selecting the reference cells disposed on one of the rows on which a selected one of the memory cells is disposed; and
        (b) setting threshold voltages of said selected reference cells at values determined based on said preliminarily determined threshold voltages of the MOS transistor.

2. A method as claimed in claim 1, further comprising the step, which is carried out when reading data stored in each of the memory cells, of:
    determining data stored in the selected memory cell by comparing an actual threshold voltage of the MOS transistor of the selected memory cell sequentially with the threshold voltages of said selected reference cells.

3. A method as claimed in claim 1, wherein levels of the preliminarily determined threshold voltages are selected in such a manner that a level difference between two closest threshold voltages in magnitude thereof is larger than a predetermined allowable minimum level difference.

4. A method of using a non-volatile semiconductor memory device comprising a plurality of row and column lines, a plurality of memory cells disposed at respective intersections of said row lines and said column lines and a plurality of reference cells disposed on each of said row lines, each of said memory cells including a MOS transistor having a substrate, a drain and source formed on one surface of said substrate and spaced apart, a channel region disposed between said drain and source and a lamination of a tunnel insulating film, a floating gate, an interlayer insulating film and a control gate formed in that order on the channel region, wherein each of said reference cells has the same electrical characteristic as that of the memory cell, said method comprising the steps of:

(1) when writing data into each of said memory cells:
 (a) presetting threshold voltages of said MOS transistor to correspond to at least three different data to be stored in each of said memory cells; and
 (b) applying to the control gate and the drain of the MOS transistor included in a selected one of said memory cells, respectively, a selected high voltage, and a voltage determined according to one of said preset threshold voltages corresponding to one of said at least three different data to be stored in said selected memory cell while maintaining the source in a floating voltage condition; and (2) when reading out data stored in each of the memory cells:
 (a) selecting the reference cells disposed on one of the row lines on which a selected one of the memory cells is disposed; and
 (b) setting threshold voltages of said selected reference cells at values determined based on said preset threshold voltages of the MOS transistor.

5. A method as claimed in claim 4, further comprising the steps, which are carried out when reading out data stored in the memory device, of:
 determining data stored in said selected memory cell by comparing a drain current of said selected memory cell successively with drain currents of said selected reference cells; and
 outputting a result of said determination.

6. A method as claimed in claim 4, wherein a pulse voltage is applied to the drain electrode of the MOS transistor of the selected memory cell, and a voltage of a constant level is applied to the control gate thereof.

7. A method as claimed in claim 6, wherein the pulse voltage applied to the drain electrode has a level and a width, one of which is determined in correspondence with said selected threshold voltage.

8. A method as claimed in claim 4, wherein the source of the MOS transistor of said selected memory cell is brought into a floating state.

9. A method as claimed in claim 4, wherein a pulse voltage is applied to the control gate of the MOS transistor of said selected memory cell, and a voltage with a constant level is applied to the drain thereof.

10. A method as claimed in claim 4, wherein four different data are selectively written into said non-volatile semiconductor memory, and the threshold voltages of the MOS transistor which are preliminarily set in correspondence with said data are 2 V, 3 V, 4 V and 5 V.

11. A method as claimed in claim 4, wherein four different data are selectively written into said each of said memory cells, and the threshold voltages of said MOS transistor which are preliminarily set in accordance with said data are 1 V, 3 V, 5 V and 7 V.

12. A method as claimed in claim 4, wherein levels of the preliminarily set threshold voltages are selected in such a manner that a level difference between the closest threshold voltages in magnitude thereof is larger than a predetermined allowable minimum level difference.

13. A method as claimed in claim 1, further comprising the steps, which are carried out when reading out data stored in each memory cell, of:
 determining data stored in said selected memory cell by comparing a drain current of said selected memory cell successively with drain currents of said selected reference cells; and outputting a result of said determination.

* * * * *